(12) United States Patent
Park et al.

(10) Patent No.: US 7,590,010 B2
(45) Date of Patent: Sep. 15, 2009

(54) DATA OUTPUT CIRCUIT IN SEMICONDUCTOR MEMORY DEVICE

(75) Inventors: Taek-Seon Park, Seoul (KR); Sung-Min Yim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 35 days.

(21) Appl. No.: 12/006,682

(22) Filed: Jan. 4, 2008

(65) Prior Publication Data

US 2008/0170452 A1 Jul. 17, 2008

(30) Foreign Application Priority Data

Jan. 11, 2007 (KR) .................... 10-2007-0003414

(51) Int. Cl.
*G11C 7/10* (2006.01)
(52) U.S. Cl. ..................... 365/189.05; 365/189.17; 365/189.15; 365/189.08; 365/202; 365/205; 365/207
(58) Field of Classification Search ............ 365/189.15, 365/189.17, 189.05, 189.08, 202, 205, 207
See application file for complete search history.

(56) References Cited

U.S. PATENT DOCUMENTS

| | | | | |
|---|---|---|---|---|
| 4,553,052 A | * | 11/1985 | Takahashi | 327/65 |
| 4,715,017 A | * | 12/1987 | Iwahashi | 365/230.08 |
| 5,305,261 A | * | 4/1994 | Furutani et al. | 365/189.17 |
| 5,321,318 A | * | 6/1994 | Montreuil | 307/326 |
| 5,325,328 A | * | 6/1994 | Muroya et al. | 365/189.05 |
| 5,398,213 A | * | 3/1995 | Yeon et al. | 365/238.5 |
| 5,544,101 A | * | 8/1996 | Houston | 365/189.02 |
| 5,751,649 A | * | 5/1998 | Kornachuk et al. | 365/205 |
| 6,037,824 A | * | 3/2000 | Takahashi | 327/337 |
| 6,104,653 A | * | 8/2000 | Proebsting | 365/203 |
| 6,108,254 A | * | 8/2000 | Watanabe et al. | 365/202 |
| 6,111,796 A | * | 8/2000 | Chang et al. | 365/196 |
| 6,163,862 A | * | 12/2000 | Adams et al. | 714/718 |
| 6,275,441 B1 | * | 8/2001 | Oh | 365/189.18 |
| 6,329,857 B1 | * | 12/2001 | Fletcher | 327/215 |
| 6,329,942 B1 | * | 12/2001 | Nagaraj et al. | 341/158 |
| 6,424,577 B2 | * | 7/2002 | Sim | 365/189.05 |
| 6,442,089 B1 | * | 8/2002 | Fletcher et al. | 365/207 |
| 6,453,433 B1 | | 9/2002 | Vollrath | 714/718 |
| 6,552,954 B2 | * | 4/2003 | Fujisawa et al. | 365/233.1 |

(Continued)

OTHER PUBLICATIONS

Korean Patent Application No. 1020040097043 to Jeon, having Publication date of May 29, 2006 (w/ English Abstract page).

(Continued)

*Primary Examiner*—Viet Q Nguyen
(74) *Attorney, Agent, or Firm*—Monica H. Choi (57) ABSTRACT

A data output circuit includes a sense amplifier and first and second latches. The sense amplifier is for amplifying differential data to generate amplified differential data. The first latch is for latching the amplified differential data to generate first latched data having a same phase as the amplified differential data. The second latch is for latching the amplified differential data to generate second latched data having an opposite phase from the amplified differential data. The amplified differential data from outputs of the sense amplifier are applied substantially simultaneously to inputs of the first and second latches.

18 Claims, 8 Drawing Sheets

U.S. PATENT DOCUMENTS

| | | | |
|---|---|---|---|
| 6,707,321 B2 * | 3/2004 | Cho et al. | 327/51 |
| 6,768,692 B2 * | 7/2004 | Luk et al. | 365/205 |
| 6,844,926 B2 * | 1/2005 | Itaka | 365/189.05 |
| 6,965,262 B2 * | 11/2005 | Zerbe | 327/336 |
| 7,123,321 B2 * | 10/2006 | Inada et al. | 349/106 |
| 7,397,722 B1 * | 7/2008 | Starnes | 365/230.03 |
| 2006/0023524 A1 | 2/2006 | Konishi | |

OTHER PUBLICATIONS

Japanese Patent Application No. 04-152425 to Koji, having Publication date of Dec. 24, 1993 (w/ English Abstract page).

* cited by examiner

DATA OUTPUT CIRCUIT IN SEMICONDUCTOR MEMORY DEVICE

BACKGROUND OF THE INVENTION

This application claims priority under 35 USC § 119 to Korean Patent Application No. 2007-0003414, filed on Jan. 11, 2007 in the Korean Intellectual Property Office, the disclosure of which is incorporated herein in its entirety by reference.

1. Field of the Invention

The present invention relates generally to semiconductor memory devices, and more particularly, to a data output circuit of a semiconductor memory device that properly adjusts for data from true and complementary memory cells.

2. Background of the Invention

A semiconductor memory device stores data in memory cells and outputs data stored in memory cells to an external circuit. Data may not be accurately written or read due to asymmetry of metal lines or process deviation. To reduce such inaccuracies, complementary cells as well as true cells are used in a memory array of the semiconductor memory device.

Conventionally, a complementary cell is tested by varying test patterns in a memory tester. However, the complementary cell may not be accurately tested conventionally since core architecture of the semiconductor memory device has been changed. To mitigate such problems in the conventional method, a multiplexer 10 as shown in FIG. 1 is employed such that a pair of output lines in a complementary cell path are inversely coupled with respect to a pair of output lines in a true cell path.

Figure 1:
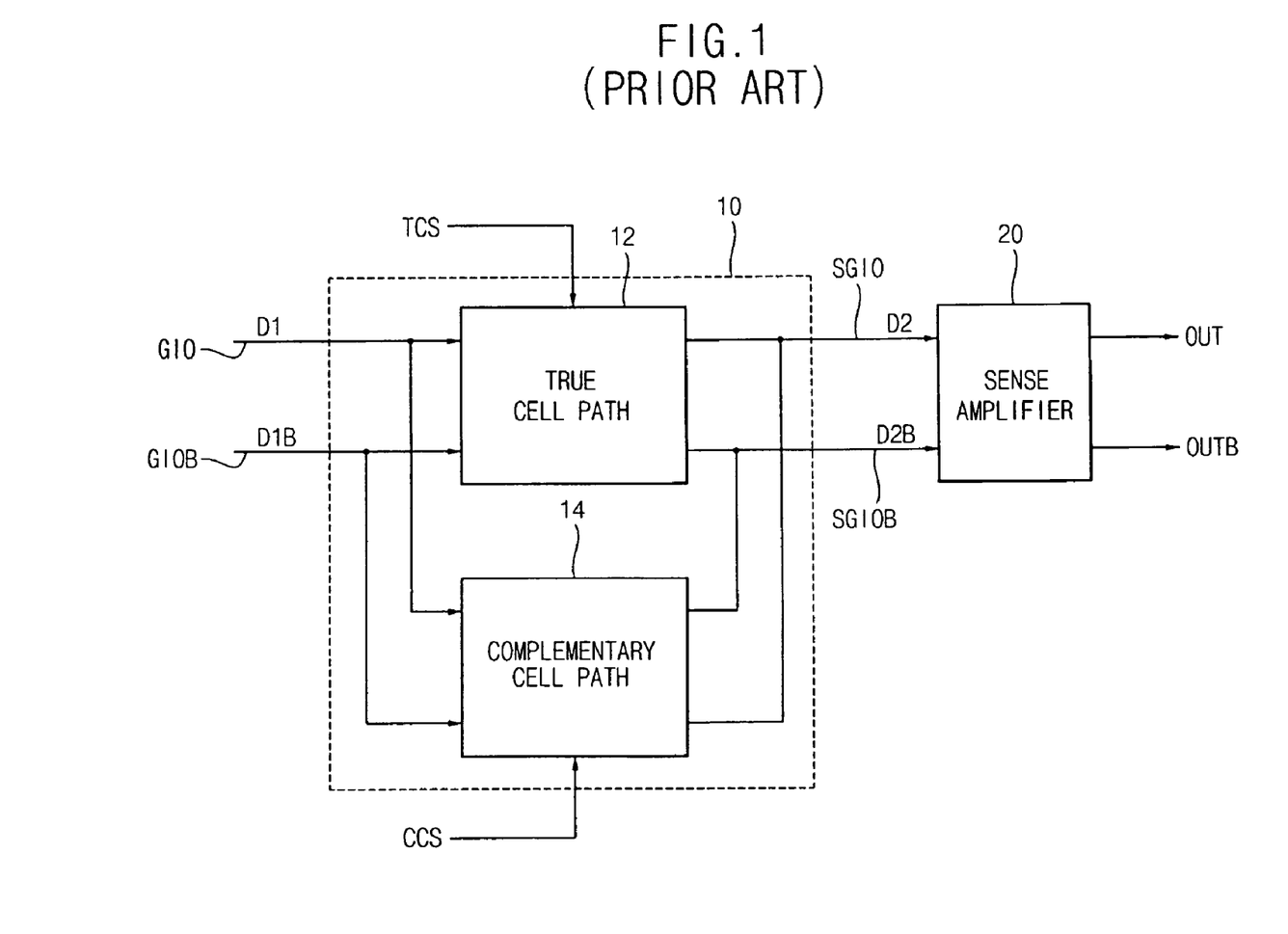
FIG. 1 is a block diagram of a data output circuit in a semiconductor memory device, according to the prior art.

FIG. 1 shows a block diagram of a data output circuit in a semiconductor memory device, according to the prior art. Referring to FIG. 1, the data output circuit includes a multiplexer 10 and a sense amplifier 20. The multiplexer 10 includes a true cell path 12 and a complementary cell path 14.

The multiplexer 10 receives differential data D1 and D1B from global input/output data lines GIO and GIOB and generates selected differential data D2 and D2B to selected input/output data lines SGIO and SGIOB in response to a true cell control signal TCS and a complementary cell control signal CCS. The sense amplifier 20 senses and amplifies the selected differential data D2 and D2B to generate differential output data OUT and OUTB.

The true cell path 12 outputs a non-inverted differential data D1 as a non-inverted selected data D2 at a non-inverted data line SGIO, and outputs inverted differential data D1B as an inverted selected data D2B at an inverted data line SGIOB, in response to the true cell control signal TCS that is activated. The complementary cell path 14 outputs the non-inverted differential data D1 as the inverted selected data D2B at the inverted data line SGIOB, and outputs the inverted differential data D1B as the non-inverted selected data D2 at the non-inverted data line SGIO, in response to the complementary cell control signal CCS.

The conventional semiconductor memory device with the multiplexer 10 of FIG. 1 may test a complementary cell without variation of test patterns in a memory tester. However, the data D1 and D1B from the memory cell input to the multiplexer 10 and the data D2 and D2B output from the multiplexer 10 may not be sufficiently developed.

Currents or voltages representing the data D1, D1B, D2 and D2B may not be sufficient to be sensed. Since the true cell path 12 and the complementary cell path 14 are located at the input side of the sense amplifier 20, loading of the I/O lines SGIO and SGIOB is increased. With such increased loading, the transferred data may not be accurately sensed, and sensing speed may decrease due to mismatches between transistors and lines included in the multiple data output paths.

SUMMARY OF THE INVENTION

Accordingly, a data output circuit in a semiconductor memory device is formed with multiple data paths at the output side of a sense amplifier for accurately testing a complementary memory cell without deterioration of sensed data.

A data output circuit according to an aspect of the present invention includes a sense amplifier and first and second latches. The sense amplifier is for amplifying differential data to generate amplified differential data. The first latch is for latching the amplified differential data to generate first latched data having a same phase as the amplified differential data. The second latch is for latching the amplified differential data to generate second latched data having an opposite phase from the amplified differential data. The amplified differential data from outputs of the sense amplifier are applied substantially simultaneously to inputs of the first and second latches.

In another embodiment of the present invention, the data output circuit further includes a multiplexer for transferring the differential data from selected global I/O lines to inputs of the sense amplifier.

In a further embodiment of the present invention, the first latch is disabled when the second latch is enabled, and the second latch is disabled when the first latch is enabled. For example, the first latch is enabled when a true cell is read, and the second latch is enabled when a complementary cell is read.

In another embodiment of the present invention, the first latch is enabled/disabled in response to a true cell control signal, and the second latch is enabled/disabled in response to a complementary cell control signal. The data output circuit includes a controller for generating the true cell control signal and the complementary cell control signal depending on a type of memory cell generating the differential data to the sense amplifier.

In an example embodiment of the present invention, the controller includes a data processor and a memory device having sequences of instructions thereon. Execution of the sequences of instructions by the data processor causes the data processor to perform the step of activating one of the true cell control signal and the complementary cell control signal depending on the type of memory cell generating the differential data to the sense amplifier.

In another example embodiment of the present invention, the first latch includes first and second PMOS transistors, and includes first, second, third, fourth, and fifth NMOS transistors. The first PMOS transistor has a source coupled to a power supply voltage, a drain coupled to a first node, and a gate coupled to a second node. The second PMOS transistor has a source coupled to the power supply voltage, a drain coupled to the second node, and a gate coupled to the first node. The first latched data is generated at the first and second nodes.

The first NMOS transistor has a drain coupled to the first node and a gate coupled to the second node, and the second NMOS transistor has a drain coupled to the second node and a gate coupled to the first node. The third NMOS transistor has a source coupled to a third node and a drain coupled to a source of the first NMOS transistor, and the fourth NMOS transistor having a source coupled to the third node and a drain coupled to a source of the second NMOS transistor. The amplified differential data are applied across gates of the third and fourth NMOS transistors. The fifth NMOS transistor has a source coupled to a ground voltage, a drain coupled to the third node, and a gate with the true cell control signal applied thereon.

In a further embodiment of the present invention, the second latch includes first and second PMOS transistors, and includes first, second, third, fourth, and fifth NMOS transistors. The first PMOS transistor has a source coupled to a power supply voltage, a drain coupled to a first node, and a gate coupled to a second node. The second PMOS transistor has a source coupled to the power supply voltage, a drain coupled to the second node, and a gate coupled to the first node. The second latched data is generated at the first and second nodes.

The first NMOS transistor has a drain coupled to the first node and a gate coupled to the second node, and the second NMOS transistor has a drain coupled to the second node and a gate coupled to the first node. The third NMOS transistor has a source coupled to a third node and a drain coupled to a source of the first NMOS transistor, and the fourth NMOS transistor has a source coupled to the third node and a drain coupled to a source of the second NMOS transistor. The amplified differential data are applied across gates of the third and fourth NMOS transistors. The fifth NMOS transistor has a source coupled to a ground voltage, a drain coupled to the third node, and a gate with the complementary cell control signal applied thereon.

The present invention may be used to particular advantage when the output circuit is used for testing a memory cell array having a memory cell that generates the differential data applied to the sense amplifier in a semiconductor memory device. In that case, the semiconductor memory device includes the memory cell array, the data output circuit, and an output buffer that generates output data from at least one of the first and second latched data.

In this manner, the true cell path and the complementary cell path are separate paths that are disposed at the output side of the sense amplifier. Thus, loading at the input side of the sense amplifier is minimized for enhanced sensitivity of the sense amplifier.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, and 8 refer to elements having similar structure and/or function.

DETAILED DESCRIPTION OF THE INVENTION

Embodiments of the present invention are now described more fully with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
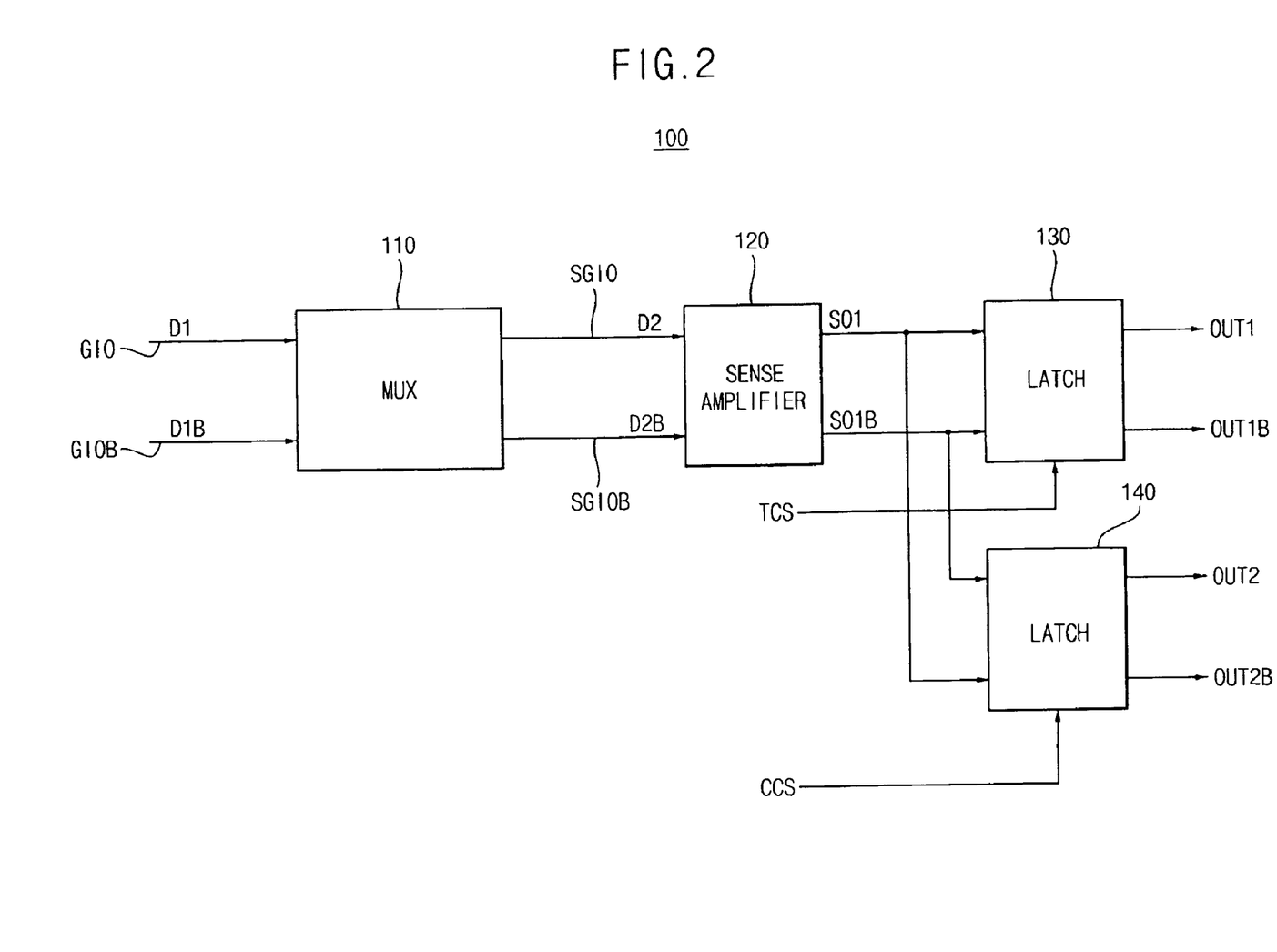
FIG. 2 is a block diagram of a data output circuit in a semiconductor memory device, according to an example embodiment of the present invention.

FIG. 2 shows a block diagram of a data output circuit 100 in a semiconductor memory device according to an example embodiment of the present invention. Referring to FIG. 2, the data output circuit 100 includes a multiplexer 110, a sense amplifier 120, a first latch 130, and a second latch 140.

The multiplexer 110 selects differential data D1 and D1B on differential global I/O (input/output) lines GIO and GIOB, respectively, to be transferred as sensed differential data D2 and D2B, respectively, on sensed differential I/O lines SGIO and SGIOB, respectively. The sensed differential data D2 and D2B have the same logic levels as the differential data D1 and D1B, respectively, that are generated by a memory cell on the global I/O lines GIO and GIOB, respectively.

The sense amplifier 120 amplifies the sensed differential data D2 and D2B to generate amplified differential data SO1 and SO1B. The amplified differential data SO1 and SO1B are applied substantially simultaneously on respective inputs of the first and second latches 130 and 140, according to an aspect of the present invention.

When enabled by a true cell control signal TCS that is activated, the first latch 130 latches the amplified differential data SO1 and SO1B to generate first latched differential data OUT1 and OUT1B having substantially the same phases as the amplified differential data SO1 and SO1B, respectively. When enabled by a complementary cell control signal CCS that is activated, the second latch 140 latches the amplified differential data SO1 and SO1B to generate second latched differential data OUT2 and OUT2B having substantially opposite phases from the amplified differential data SO1 and SO1B, respectively.

Thus, the first latched data OUT1 of the first latch 130 has a same phase as the amplified data SO1 of the sense amplifier 120, and the second latched data OUT2 of the second latch 140 has the opposite phase by being an inversion of the amplified data SO1 of the sense amplifier 120. Similarly, the first latched data OUT1B of the first latch 130 has a same phase as the amplified data SO1B of the sense amplifier 120, and the second latched data OUT2B of the second latch 140 has the opposite phase by being an inversion of the amplified data SO1B of the sense amplifier 120.

The first latch 130 is enabled when the true cell control signal TCS is activated to a logic high level, and is disabled when the true cell control signal TCS is inactivated to a logic low level. The second latch 140 is enabled when the complementary cell control signal CCS is activated to a logic high level, and is disabled when the complementary cell control signal CCS is inactivated to a logic low level.

Figure 8:
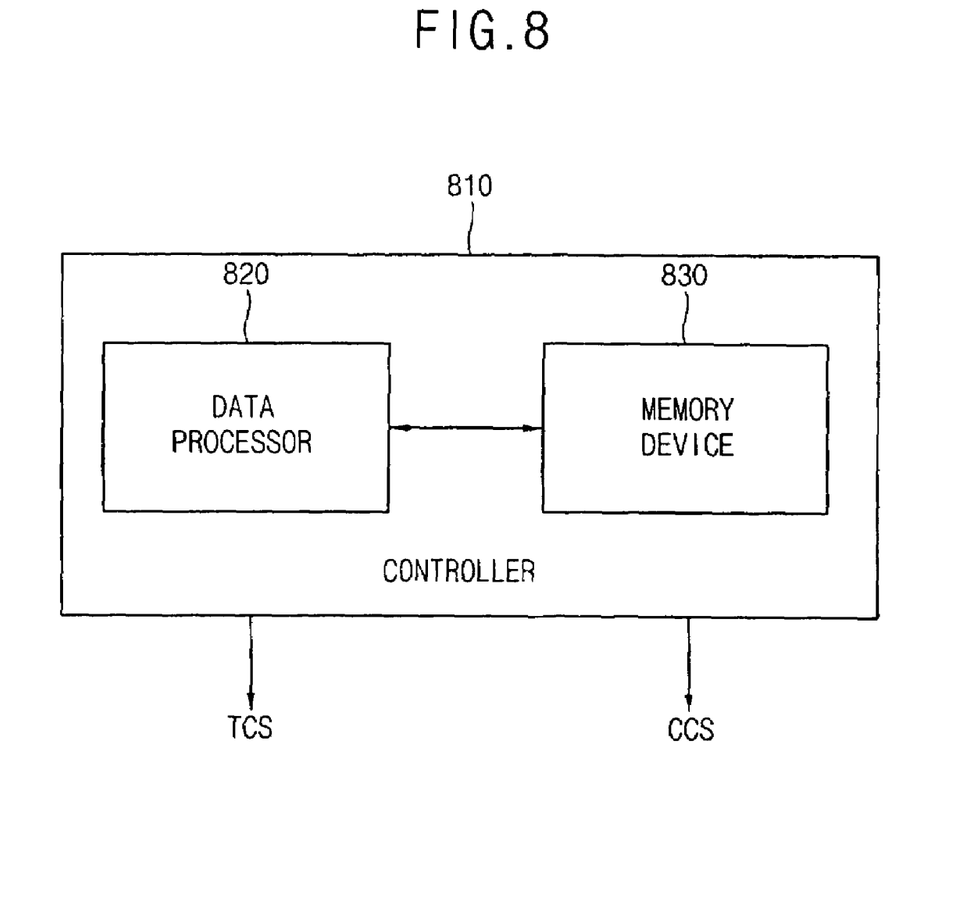
FIG. 8 shows a block diagram of a controller for generating control signals used in the data output circuit of FIG. 2, according to an example embodiment of the present invention.

FIG. 8 shows a block diagram of a controller 810 that may be formed as part of the data output circuit 100 or may be a memory controller for generating the true cell control signal TCS and the complementary cell control signal CCS. The controller 810 includes a data processor 820 and a memory device 830 having sequences of instructions (i.e., software) stored thereon. Execution of such sequences of instructions by the data processor 820 causes the data processor 820 to generate the true cell control signal TCS and the complementary cell control signal CCS according to the type of memory cell that generates the differential data D1 and D1B.

If the memory cell that generates the differential data D1 and D1B is a true memory cell, then the data processor 820 activates the true cell control signal TCS and inactivates the complementary cell control signal CCS. On the other hand, if the memory cell that generates the differential data D1 and D1B is a complementary memory cell, then the data processor 820 inactivates the true cell control signal TCS and activates the complementary cell control signal CCS. Thus, the first latch 130 is enabled while the second latch 140 is disabled, or the second latch 140 is enabled while the first latch 130 is disabled, depending on the type of memory cell that generates the differential data D1 and D1B. Such information may be programmed into the memory device 830 in an example embodiment of the present invention.

Figure 3:
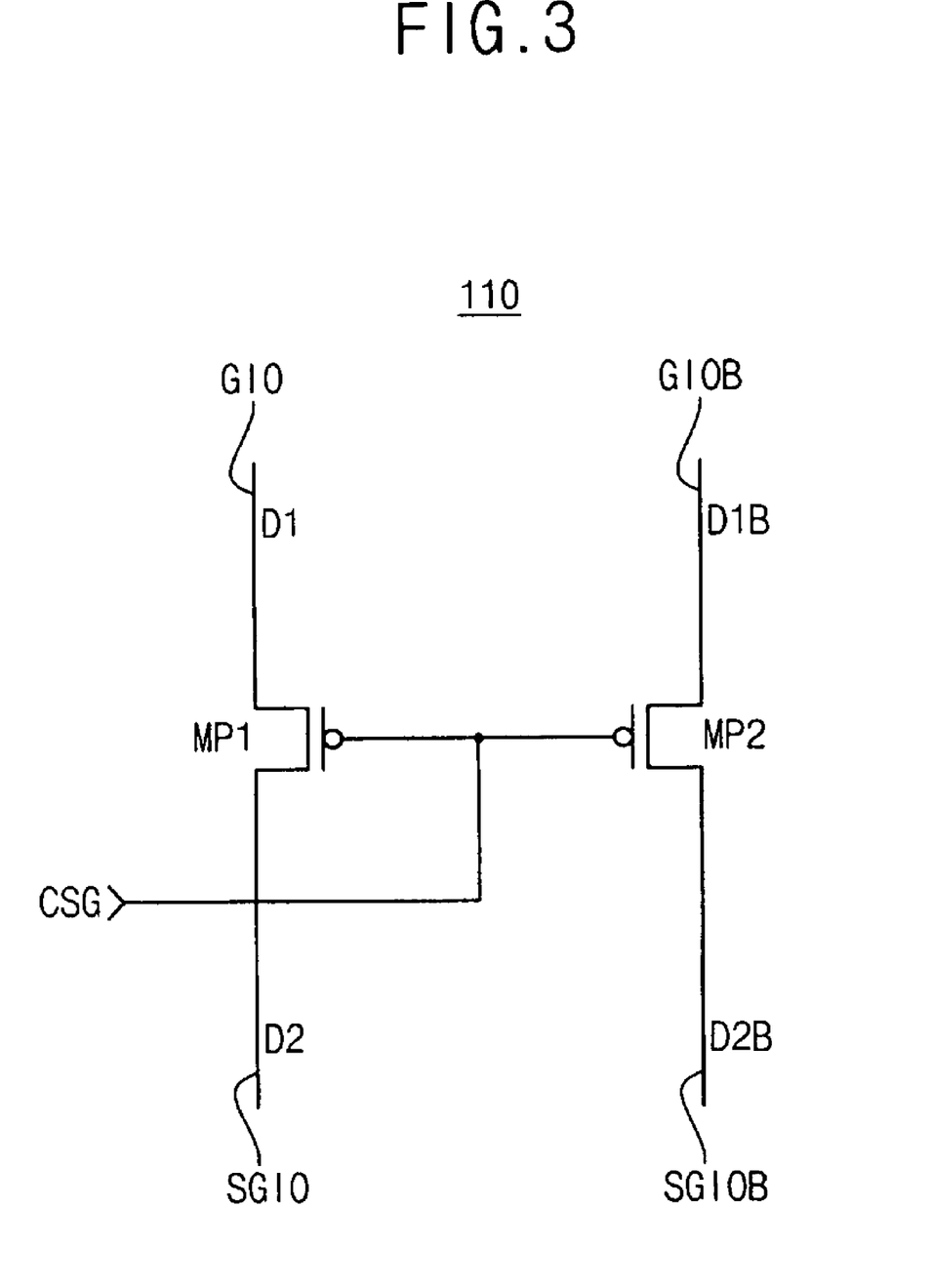
FIG. 3 is a circuit diagram of a multiplexer in the data output circuit of FIG. 2, according to an example embodiment of the present invention.

FIG. 3 is a circuit diagram of the multiplexer 110 in the data output circuit 100 of FIG. 2, according to an embodiment of the present invention. Referring to FIG. 3, the multiplexer 110 includes a first PMOSFET (P-channel metal oxide semiconductor field effect transistor) MP1 and a second PMOSFET MP2.

The first PMOSFET MP1 has a source coupled to the first global I/O line GIO, a gate with a selection control signal CSG applied thereon, and a drain coupled to the first sensed I/O line SGIO. The second PMOSFET MP2 has a source coupled to the second global I/O line GIOB, a gate with the selection control signal CSG applied thereon, and a drain coupled to the second sensed I/O line SGIOB. The selection control signal CSG is activated for turning on the PMOSFETs MP1 and MP2 when the memory cell generating the differential data D1 and D1B is selected. In that case, the PMOSFETs MP1 and MP2 are turned on to transfer the differential data D1 and D1B from such a memory cell to the sensed I/O lines SGIO and SGIOB, respectively.

Figure 4:
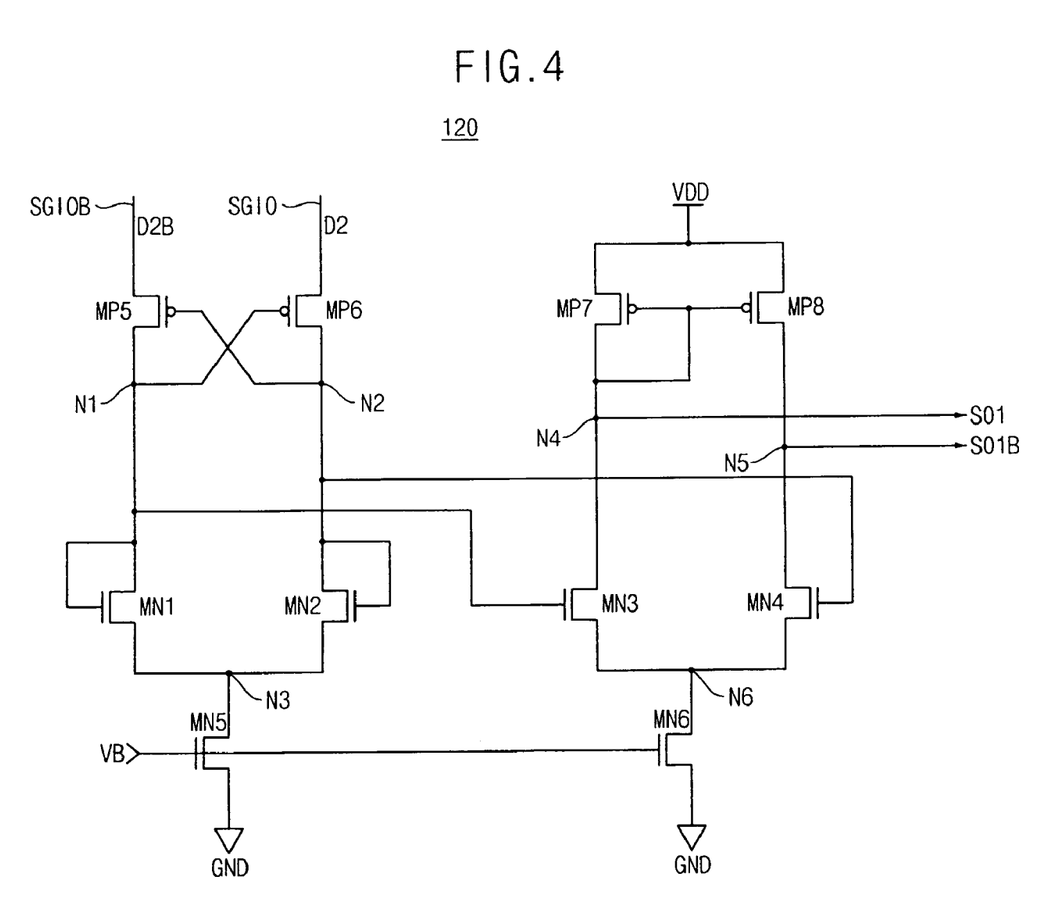
FIG. 4 is a circuit diagram of a sense amplifier in the data output circuit of FIG. 2, according to an example embodiment of the present invention.

FIG. 4 is a circuit diagram of the sense amplifier 120 in the data output circuit 100 of FIG. 2, according to an embodiment of the present invention. Referring to FIG. 4, the sense amplifier 120 includes a first stage amplifier and a second stage amplifier. The first stage amplifier includes a first PMOSFET MP5, a second PMOSFET MP6, a first NMOSFET (N-channel metal oxide semiconductor field effect transistor) MN1, a second NMOSFET MN2, and a third NMOSFET MN5, configured as illustrated in FIG. 4. The second stage amplifier includes a third PMOSFET MP7, a fourth PMOSFET MP8, a fourth NMOSFET MN3, a fifth NMOSFET MN4, and a sixth NMOSFET MN6, configured as illustrated in FIG. 4.

The gates of the NMOSFETs MN5 and MN6 have a bias voltage VB applied thereon. The sensed differential I/O lines SGIO and SGIOB are coupled to sources of the PMOFETs MP5 and MP6. Voltages generated at output nodes N1 and N2 of first stage amplifier are applied to gates of the NMOSFETs MN3 and MN4 of the second stage amplifier. Thus, the amplified differential data SO1 and SO1B are generated at nodes N4 and N5 of the second stage amplifier, through sequential amplification through the first and second stage amplifiers in FIG. 4.

Figure 5:
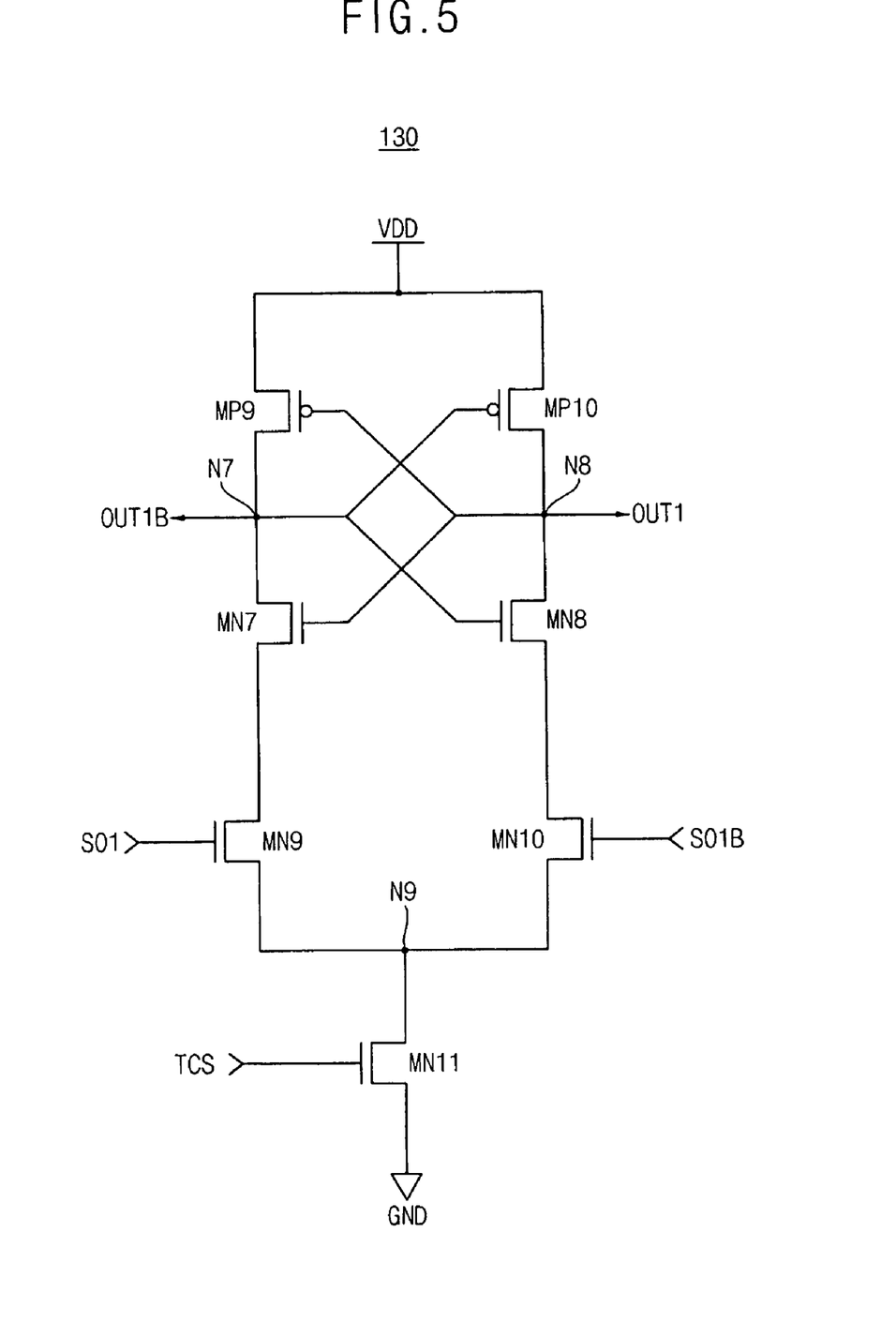
FIG. 5 is a circuit diagram of a first latch in the data output circuit of FIG. 2, according to an example embodiment of the present invention.

FIG. 5 is a circuit diagram of the first latch 130 in the data output circuit 100 of FIG. 2, according to an embodiment of the present invention. Referring to FIG. 5, the first latch 130 includes a first PMOSFET MP9, a second PMOSFET MP10, a first NMOSFET MN7, a second NMOSFET MN8, a third NMOSFET MN9, a fourth NMOSFET MN10, and a fifth NMOSFET MN11.

Further referring to FIG. 5, the first PMOSFET MP9 has a source coupled to a high power supply voltage VDD, a drain coupled to a first node N7, and a gate coupled to a second node N8. The second PMOSFET MP10 has a source coupled to the high power supply voltage VDD, a drain coupled to the second node N8, and a gate coupled to the first node N7. The first latched data OUT1 and OUT1B are generated at the second and first nodes N8 and N7, respectively.

Also referring to FIG. 5, the first NMOSFET MN7 has a drain coupled to the first node N7 and a gate coupled to the second node N8. The second NMOSFET MN8 has a drain coupled to the second node N8 and a gate coupled to the first node N7. The third NMOSFET MN9 has a source coupled to a third node N9, a drain coupled to a source of the first NMOSFET MN7, and a gate having the first amplified data SO1 applied thereon.

Further referring to FIG. 5, the fourth NMOSFET MN10 has a source coupled to the third node N9, a drain coupled to a source of the second NMOSFET MN8, and a gate having the sensed differential data SO1B applied thereon. The fifth NMOSFET MN11 has a source coupled to a ground voltage GND, a drain coupled to the third node N9, and a gate having the true cell control signal TCS applied thereon.

Figure 6:
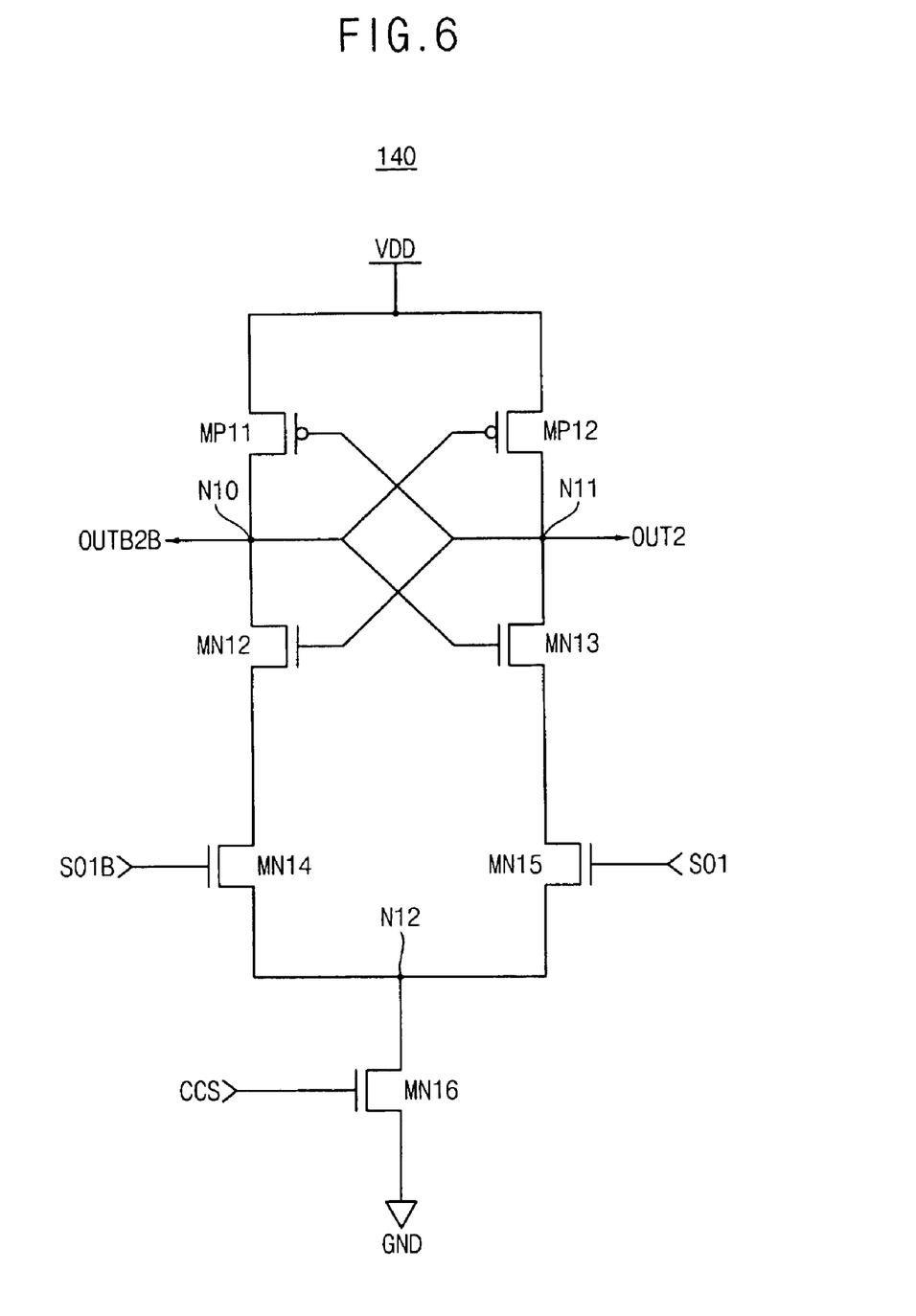
FIG. 6 is a circuit diagram of a second latch in the data output circuit of FIG. 2, according to an example embodiment of the present invention.

FIG. 6 is a circuit diagram of the second latch 140 in the data output circuit 100 of FIG. 2. Referring to FIG. 6, the second latch 140 includes a first PMOSFET MP11, a second PMOSFET MP12, a first NMOSFET MN12, a second NMOSFET MN13, a third NMOSFET MN14, a fourth NMOSFET MN15, and a fifth NMOSFET MN16.

Referring to FIG. 6, the first PMOSFET MP11 has a source coupled to the high power supply voltage VDD, a drain coupled to a first node N10, and a gate coupled to a second node N11. The second PMOSFET MP12 has a source coupled to the high power supply voltage VDD, a drain coupled to the second node N11, and a gate coupled to the first node N10. The first NMOSFET MN12 has a drain coupled to the first node N10 and a gate coupled to the second node N11. The second NMOSFET MN13 has a drain coupled to the second node N11 and a gate coupled to the first node N11. The second latched data OUT2 and OUT2B are generated at the second and first nodes N11 and N10, respectively.

Also referring to FIG. 6, the third NMOSFET MN14 has a source coupled to a third node N12, a drain coupled to a source of the first NMOSFET MN12, and a gate with the amplified differential data SO1B applied thereon. The fourth NMOSFET MN15 has a source coupled to the third node N12, a drain coupled to a source of the second NMOSFET MN13, and a gate with the amplified differential data SO1 applied thereon. The fifth NMOSFET MN16 has a source coupled to the ground voltage GND, a drain coupled to the third node N13, and a gate with the complement cell control signal CCS applied thereon.

Figure 7:
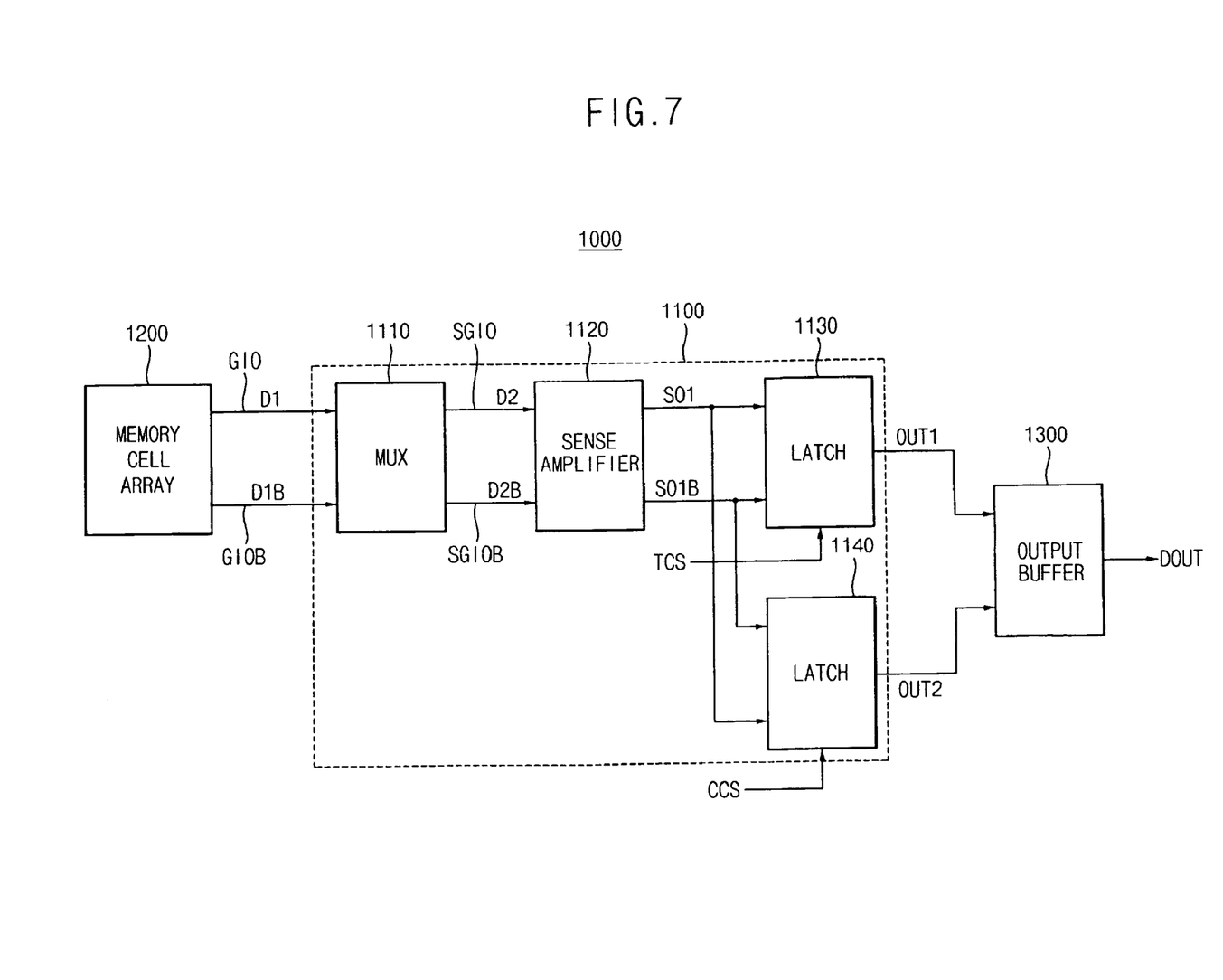
FIG. 7 is a block diagram of a semiconductor memory device including the data output circuit of FIG. 2, according to an example embodiment of the present invention.

FIG. 7 is a block diagram of a semiconductor memory device 1000 including the data output circuit 100 of FIG. 2, according to an example embodiment of the present invention. Referring to FIG. 7, the semiconductor memory device 1000 includes a memory cell array 1200, a data output circuit 1100 implemented similarly as the data output circuit 100 of FIG. 2, and an output buffer 1300.

The memory cell array 1200 includes true cells and complementary cells. A true cell stores data having a logic level same as a desired data, and a complementary cell stores data having a logic level that is an inverse of the desired data. The data output circuit 1100 receives differential data D1 and D1B from a memory cell of the memory cell array 1200. The multiplexer 1110 transmits such differential data D1 and D1B as sensed differential data D2 and D2B to a sense amplifier 1120 that amplifies such differential data D2 and D2B to generate amplified differential data SO1 and SO1B.

The data output circuit 1100 includes a first latch 1130 and a second latch 1140. The amplified differential data SO1 and SO1B are applied substantially simultaneously to the first and second latches 1130 and 1140. The first latch 1130 is enabled to latch the amplified differential data SO1 and SO1B to generate first latched data OUT1 and OUT1B having substantially the same phases as the amplified differential data SO1 and SO1B, respectively, when the memory cell generating the differential data D1 and D1B is a true memory cell.

Alternatively, the second latch 1140 is enabled to latch the amplified differential data SO1 and SO1B to generate second latched data OUT2 and OUT2B having substantially inverted phases from the amplified differential data SO1 and SO1B, respectively, when the memory cell generating the differential data D1 and D1B is a complementary memory cell. Thus, the components 1110, 1120, 1130, and 1140 of FIG. 7 operate similarly as components 110, 120, 130, and 140, respectively, of FIG. 4.

The inverted output data OUT1B and OUT2B of the latches 1130 and 1140 are omitted for convenience of illustration in FIG. 7. The output buffer 1300 receives the first latched data OUT1 and OUT1B from the first latch 1130 and the second latched data OUT2 and OUT2B from the second latch 1140 to generate output data DOUT there-from.

In this manner, the amplified differential data SO1 and SO1B from the sense amplifier 1120 are applied substantially simultaneously on the first and second latches 1130 and 1140 that provide a true cell path and a complementary cell path as separate paths. Thus, data from the memory array 1200 may be accurately and quickly sensed. In addition, the separate paths for the true cell and the complementary cell are formed at the output side of the sense amplifier 1120 for minimized loading at the input side of the sense amplifier 1120. Thus, the sense amplifier 1120 operates with high efficiency and sensitivity.

While the present invention has been particularly shown and described with reference to an exemplary embodiment thereof, it will be understood by those of ordinary skill in the art that various changes in form and details may be made therein without departing from the spirit and scope of the present invention as defined by the following claims.

The present invention is limited only as defined in the following claims and equivalents thereof.

What is claimed is:

1. A data output circuit comprising:
   a sense amplifier for amplifying differential data to generate amplified differential data;
   a first latch for latching the amplified differential data to generate first latched data having a same phase as the amplified differential data; and
   a second latch for latching the amplified differential data to generate second latched data having an opposite phase from the amplified differential data,
   wherein the amplified differential data from outputs of the sense amplifier are applied substantially simultaneously to inputs of the first and second latches,
   and wherein the first latch is disabled when the second latch is enabled, and wherein the second latch is disabled when the first latch is enabled.

2. The data output circuit of claim 1, further comprising:
   a multiplexer for transferring the differential data from selected global I/O lines to inputs of the sense amplifier.

3. The data output circuit of claim 1, wherein the first latch is enabled when a true cell is read, and wherein the second latch is enabled when a complementary cell is read.

4. The data output circuit of claim 3, wherein the first latch is enabled/disabled in response to a true cell control signal, and wherein the second latch is enabled/disabled in response to a complementary cell control signal.

5. The data output circuit of claim 4, further comprising:
   a controller for generating the true cell control signal and the complementary cell control signal depending on a type of memory cell generating the differential data to the sense amplifier.

6. The data output circuit of claim 5, wherein the controller includes:
   a data processor; and
   a memory device having sequences of instructions thereon, wherein execution of the sequences of instructions by the data processor causes the data processor to perform the step of:

activating one of the true cell control signal and the complementary cell control signal depending on the type of memory cell generating the differential data to the sense amplifier.

7. The data output circuit of claim 4, wherein the first latch comprises:
a first PMOS transistor having a source coupled to a power supply voltage, a drain coupled to a first node, and a gate coupled to a second node;
a second PMOS transistor having a source coupled to the power supply voltage, a drain coupled to the second node, and a gate coupled to the first node;
wherein the first latched data is generated at the first and second nodes;
a first NMOS transistor having a drain coupled to the first node and a gate coupled to the second node;
a second NMOS transistor having a drain coupled to the second node and a gate coupled to the first node;
a third NMOS transistor having a source coupled to a third node and a drain coupled to a source of the first NMOS transistor;
a fourth NMOS transistor having a source coupled to the third node and a drain coupled to a source of the second NMOS transistor;
wherein the amplified differential data are applied across gates of the third and fourth NMOS transistors; and
a fifth NMOS transistor having a source coupled to a ground voltage, a drain coupled to the third node, and a gate with the true cell control signal applied thereon.

8. The data output circuit of claim 4, wherein the second latch comprises:
a first PMOS transistor having a source coupled to a power supply voltage, a drain coupled to a first node, and a gate coupled to a second node;
a second PMOS transistor having a source coupled to the power supply voltage, a drain coupled to the second node, and a gate coupled to the first node;
wherein the second latched data is generated at the first and second nodes;
a first NMOS transistor having a drain coupled to the first node and a gate coupled to the second node;
a second NMOS transistor having a drain coupled to the second node and a gate coupled to the first node;
a third NMOS transistor having a source coupled to a third node and a drain coupled to a source of the first NMOS transistor;
a fourth NMOS transistor having a source coupled to the third node and a drain coupled to a source of the second NMOS transistor;
wherein the amplified differential data are applied across gates of the third and fourth NMOS transistors; and
a fifth NMOS transistor having a source coupled to a ground voltage, a drain coupled to the third node, and a gate with the complementary cell control signal applied thereon.

9. The output circuit of claim 1, wherein the output circuit is used for testing a memory cell array having a memory cell that generates the differential data applied to the sense amplifier.

10. A semiconductor memory device, comprising:
a memory cell array;
a data output circuit including:
a sense amplifier for amplifying differential data from the memory cell array to generate amplified differential data;
a first latch for latching the amplified differential data to generate first latched data having a same phase as the amplified differential data; and
a second latch for latching the amplified differential data to generate second latched data having an opposite phase from the amplified differential data,
wherein the amplified differential data from outputs of the sense amplifier are applied substantially simultaneously to inputs of the first and second latches; and
a buffer that generates output data from at least one of the first and second latched data,
and wherein the first latch is disabled when the second latch is enabled, and
wherein the second latch is disabled when the first latch is enabled.

11. The semiconductor memory device of claim 10, wherein the output circuit further includes:
a multiplexer for transferring the differential data from selected global I/O lines to inputs of the sense amplifier.

12. The semiconductor memory device of claim 10, wherein the first latch is enabled when a true cell is read, and wherein the second latch is enabled when a complementary cell is read.

13. The semiconductor memory device of claim 12, wherein the first latch is enabled/disabled in response to a true cell control signal, and wherein the second latch is enabled/disabled in response to a complementary cell control signal.

14. The semiconductor memory device of claim 13, wherein the output circuit further includes:
a controller for generating the true cell control signal and the complementary cell control signal depending on a type of memory cell generating the differential data to the sense amplifier.

15. The semiconductor memory device of claim 14, wherein the controller includes:
a data processor; and
a memory device having sequences of instructions thereon, wherein execution of the sequences of instructions by the data processor causes the data processor to perform the step of:
activating one of the true cell control signal and the complementary cell control signal depending on the type of memory cell generating the differential data to the sense amplifier.

16. The semiconductor memory device of claim 13, wherein the first latch comprises:
a first PMOS transistor having a source coupled to a power supply voltage, a drain coupled to a first node, and a gate coupled to a second node;
a second PMOS transistor having a source coupled to the power supply voltage, a drain coupled to the second node, and a gate coupled to the first node;
wherein the first latched data is generated at the first and second nodes;
a first NMOS transistor having a drain coupled to the first node and a gate coupled to the second node;
a second NMOS transistor having a drain coupled to the second node and a gate coupled to the first node;
a third NMOS transistor having a source coupled to a third node and a drain coupled to a source of the first NMOS transistor;
a fourth NMOS transistor having a source coupled to the third node and a drain coupled to a source of the second NMOS transistor;
wherein the amplified differential data are applied across gates of the third and fourth NMOS transistors; and a fifth NMOS transistor having a source coupled to a ground voltage, a drain coupled to the third node, and a gate with the true cell control signal applied thereon.

17. The semiconductor memory device of claim 13, wherein the second latch comprises:
- a first PMOS transistor having a source coupled to a power supply voltage, a drain coupled to a first node, and a gate coupled to a second node;
- a second PMOS transistor having a source coupled to the power supply voltage, a drain coupled to the second node, and a gate coupled to the first node;
- wherein the second latched data is generated at the first and second nodes;
- a first NMOS transistor having a drain coupled to the first node and a gate coupled to the second node;
- a second NMOS transistor having a drain coupled to the second node and a gate coupled to the first node;
- a third NMOS transistor having a source coupled to a third node and a drain coupled to a source of the first NMOS transistor;
- a fourth NMOS transistor having a source coupled to the third node and a drain coupled to a source of the second NMOS transistor;
- wherein the amplified differential data are applied across gates of the third and fourth NMOS transistors; and
- a fifth NMOS transistor having a source coupled to a ground voltage, a drain coupled to the third node, and a gate with the complementary cell control signal applied thereon.

18. The semiconductor memory device of claim 10, wherein the output circuit is used for testing the memory cell array having a memory cell that generates the differential data applied to the sense amplifier.

* * * * *